United States Patent [19]
Lahat et al.

[11] Patent Number: 5,797,317
[45] Date of Patent: Aug. 25, 1998

[54] UNIVERSAL CHUCK FOR HOLDING PLATES OF VARIOUS SIZES

[75] Inventors: Eitan Lahat, Rishon le Zion; Nissim Zafrani, Yavne, both of Israel

[73] Assignee: Orbot Instruments Ltd., Yavne, Israel

[21] Appl. No.: 818,312

[22] Filed: Mar. 14, 1997

[30] Foreign Application Priority Data

Sep. 6, 1996 [IL] Israel .......................... 119213

[51] Int. Cl.[6] .................................. B05C 17/08
[52] U.S. Cl. ................. 101/127.1; 101/486; 101/474; 101/DIG. 36; 101/128
[58] Field of Search ................. 101/126, 407.1, 101/474, DIG. 36, 463.1, 485, 401.1, 986, 127.1, 128.4, 128, 128.1; 269/24, 35, 304, 305, 306, 50, 51; 250/440.11, 442.11; 419/480, 481, 483, 484, 749, 751

[56] References Cited

U.S. PATENT DOCUMENTS

| | | | |
|---|---|---|---|
| 3,711,081 | 1/1973 | Cachon | 269/21 |
| 4,777,372 | 10/1988 | Guarino | 250/442.1 |
| 4,948,330 | 8/1990 | Nomura et al. | 414/749 |
| 5,129,155 | 7/1992 | Hoffman et al. | 33/614 |
| 5,133,256 | 7/1992 | Keaton | 101/DIG. 36 |
| 5,226,366 | 7/1993 | Schlife et al. | 101/485 |
| 5,255,607 | 10/1993 | Nishiyama et al. | 101/463.1 |

*Primary Examiner*—Christopher A. Bennett
*Attorney, Agent, or Firm*—Darby & Darby

[57] ABSTRACT

This invention discloses an universal chuck for holding plates, including a base having a longitudinal axis and a transverse axis, a lower carriage movable on the base along said longitudinal axis, an upper carriage movable on the lower carriage along the longitudinal axis, a plate mounting carried by the lower carriage at one side thereof for mounting one edge of a plate to be held by the universal chuck, and a plate mounting carried by the upper carriage at the side thereof opposite to the one side of the lower carriage, for mounting the opposite edge of the plate to be held by the universal chuck, such that moving the lower carriage and the upper carriage with respect to each other and with respect to the base along said longitudinal axis, changes the distance between the lower carriage and upper carriage plate mountings to thereby enable the chuck to hold plates of different longitudinal dimensions.

22 Claims, 7 Drawing Sheets

UNIVERSAL CHUCK FOR HOLDING PLATES OF VARIOUS SIZES

BACKGROUND OF THE INVENTION

The present invention relates to a universal chuck for holding plates of various sizes. The invention is particularly applicable for holding photomasks and reticles used in manufacturing semiconductor wafers, and is therefore described below with respect to this application.

Photomasks and reticles used in manufacturing semiconductor wafers are produced in various sizes, thicknesses and configurations according to the particular application. Typical are the 5", 6" and 7" square configuration, and the 7" round configuration. Such photomasks and reticles are handled by complicated processing and inspection systems. To minimize the need for presetting or preadjusting the handling equipment according to the size and configuration of the photomask/reticle, it would be highly desirable to provide a universal chuck which not only is capable of holding photomasks and reticles (or other plates) of different sizes and configurations, but which also maintains the same centerpoint irrespective of the size or configuration of the photomask or reticle held by the chuck.

SUMMARY OF THE INVENTION

An object of the present invention is to provide a universal chuck having advantages in the above respects, whose advantages make the chuck particularly useful for holding photomasks and reticles, but which also enable the chuck to be used for holding other types of plates of various sizes and/or configurations.

According to the present invention, there is provided a universal chuck for holding plates, comprising: a base having a longitudinal axis and a transverse axis; a lower carriage movable on the base along the longitudinal axis; an upper carriage movable on the lower carriage along the longitudinal axis; a plate mounting carried by the lower carriage at one side thereof for mounting one edge of a plate to be held by the universal chuck; and a plate mounting carried by the upper carriage at the side thereof opposite to the one side of the lower carriage, for mounting the opposite edge of the plate to be held by the universal chuck, such that moving the lower carriage and the upper carriage with respect to each other and with respect to the base along said longitudinal axis, changes the distance between the lower carriage and upper carriage plate mountings to thereby enable the chuck to hold plates of different longitudinal dimensions.

As will be described more particularly below, a universal chuck constructed in accordance with the foregoing features enables mounting plates of different longitudinal dimensions while maintaining the same centerpoint for all the so-mounted plates. Such a universal chuck is therefore particularly useful for mounting photomasks and reticles of different dimensions and/or configurations, and thereby eliminates or minimizes the need for presetting or preadjusting the loading, unloading, inspection and/or other handling equipment for handling such plates.

According to further features in the described preferred embodiment, the base, lower carriage and upper carriage are all of open rectangular configuration to allow access to both sides of a plate mounted by the chuck. This feature is particularly useful with respect to photomasks and reticles which, being transparent, require optical access to both sides of the photomask or reticle for inspection and/or processing.

According to further features in the preferred embodiment of the invention described below, one of the plate mountings includes a pad located on the longitudinal axis of the base, and the other of the plate mountings includes a pair of pads equally spaced transversely from the longitudinal axis of the base, such as to provide a three-point mounting for a plate held by the chuck. In the described preferred embodiment, the latter plate mounting includes a plurality of pairs of pads, which pairs are spaced from each other at different distances along both the transverse axis and the longitudinal axis of the base to accommodate plates of different longitudinal and transverse dimensions.

According to still further features in the described preferred embodiment, the plate mountings include suction ports connectable to a suction source for holding a plate by suction. In addition, the base and the lower carriage include cooperable retainer members for retaining the lower carriage in its moved position on the base, and the lower carriage and upper carriage also include cooperable retainer members for retaining the upper carriage in its moved position on the lower carriage.

According to additional features in the described preferred embodiment, the universal chuck further includes an electrical drive for the lower carriage, and a separate electrical drive for the upper carriage.

Further features and advantages of the invention will be apparent from the description below.

BRIEF DESCRIPTION OF THE DRAWINGS

The invention is herein described, by way of example only, with reference to the accompanying drawings, wherein.

DETAILED DESCRIPTION OF THE INVENTION

Figure 1:
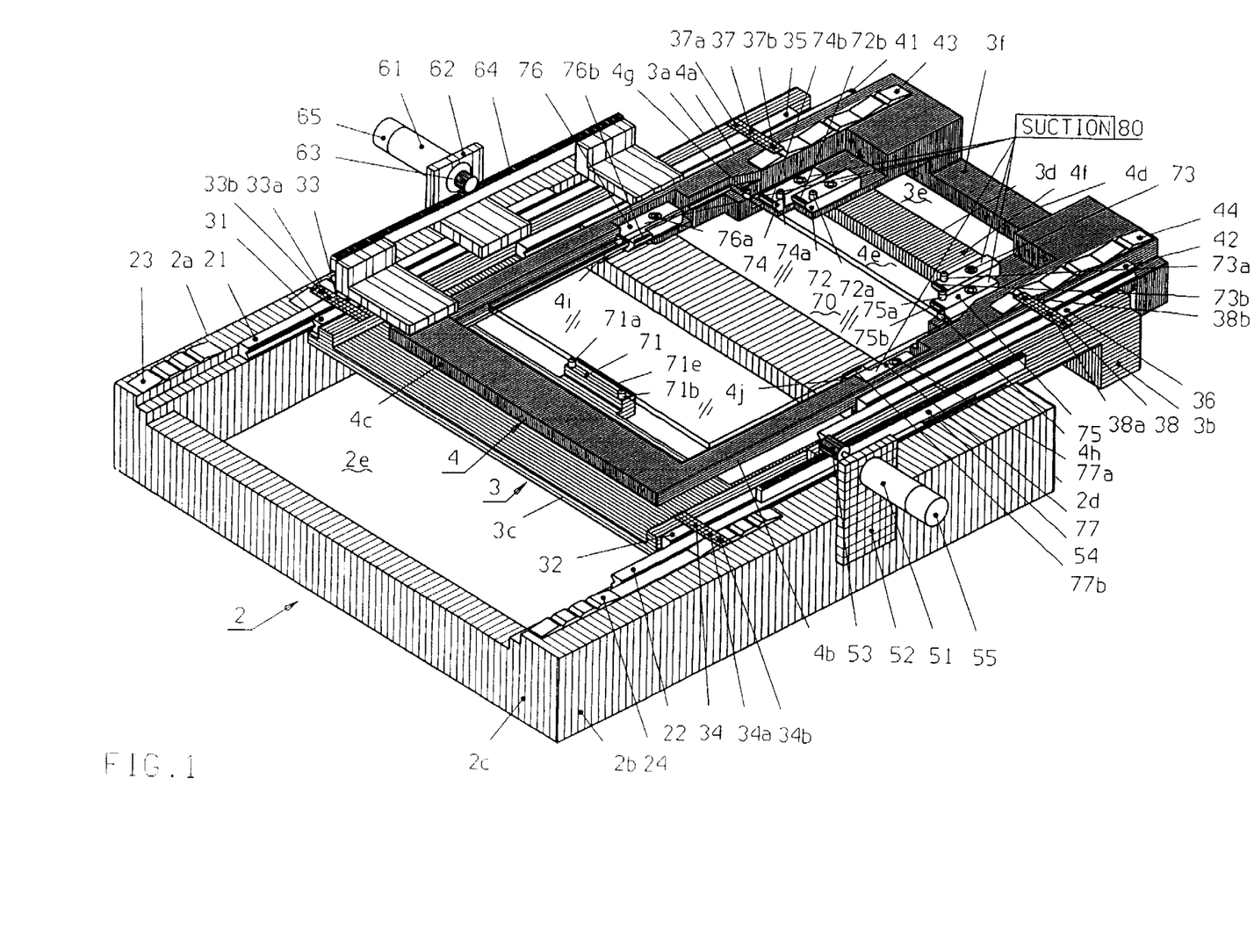
FIG. 1 is a three-dimensional view illustrating one form of universal chuck constructed in accordance with the present invention.

The universal chuck illustrated in FIG. 1 is designed for holding plates, particularly photomasks or reticles, of various sizes and configurations such as to permit access to both sides of the photomask or reticle held by the chuck for inspection and/or processing.

The illustrated universal chuck is constituted of three main components: a base 2 having a longitudinal axis LA and a transverse axis TA (see FIG. 2); a lower carriage or tray 3 movable on the base along the longitudinal axis LA; and an upper carriage or slide 4 movable on the lower carriage 3 along the longitudinal axis LA. Base 2 is of an open rectangular construction, including two longitudinal sides 2a, 2b and two transverse sides 2c, 2d defining a rectangular central opening 2e. Similarly, the lower carriage 3 is of an open rectangular construction including two longitudinal sides 3a, 3b and two transverse sides 3c, 3d defining a central rectangular opening 3e; and the upper carriage 4 is also of an open rectangular construction including two longitudinal sides 4a, 4b and two transverse sides 4c, 4d defining a central rectangular opening 4e.

Figure 7:
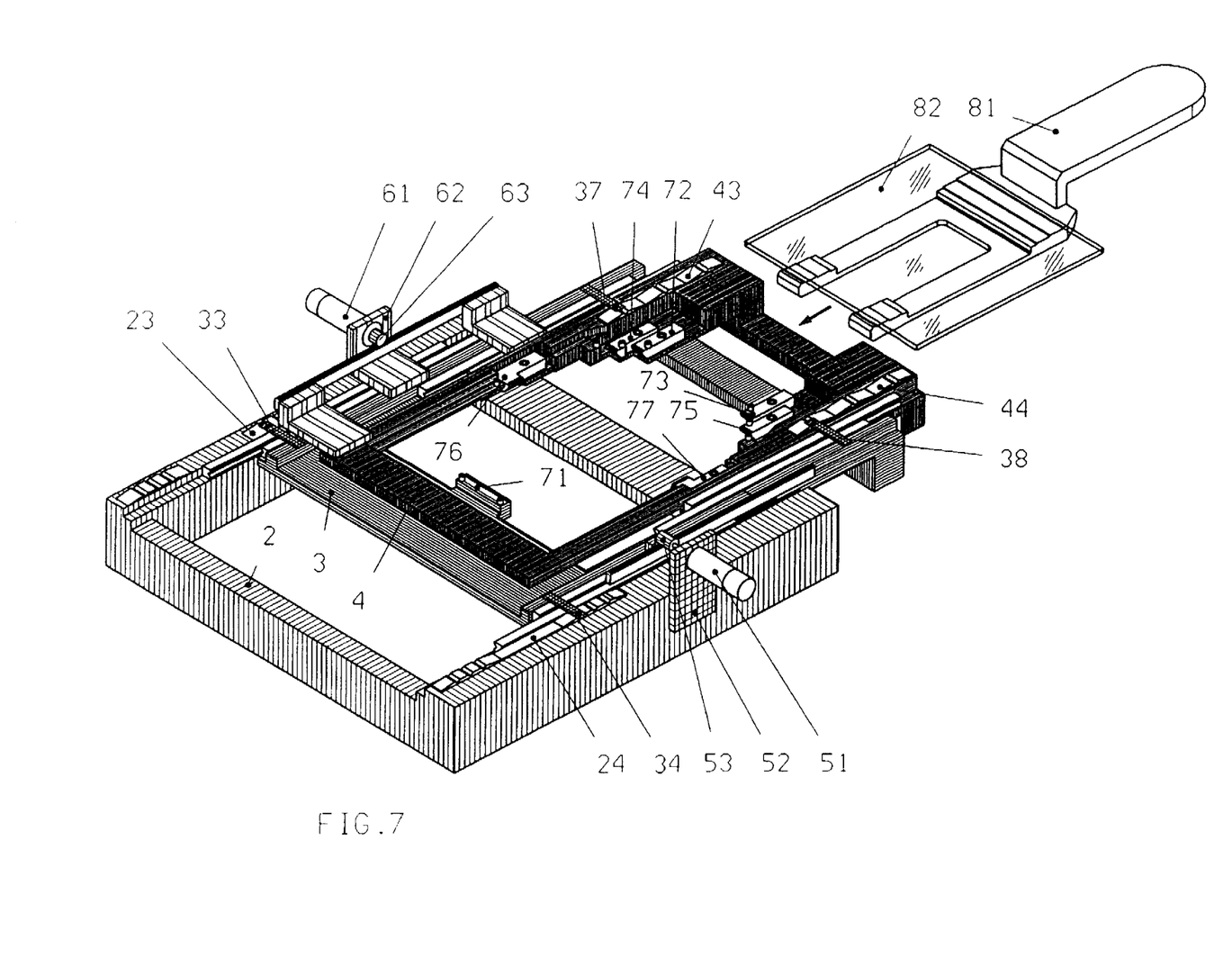
FIG. 7 is a three-dimensional view illustrating the universal chuck conditioned for loading a 7" photomask or reticle by a robot.

Side 3d of the lower carriage 3, and side 4d of the upper carriage 4, are both thickened and provided with slots 3f and 4f, respectively, for accommodating the fork arm of a robot loading the universal chuck with the plates (photomask, reticle, etc.), as will be described more particularly below with reference to FIG. 7.

The upper surfaces of the two longitudinal sides 2a, 2b of the base 2 include a pair of longitudinally-extending bearing rails 21, 22 cooperable with bearings (to be described) carried by the lower carriage 3 to permit relatively friction-free movement of the lower carriage with respect to the base 2. The upper surfaces of the base sides 2a, 2b are formed with a plurality of grooves 23, 24 spaced longitudinally of those sides cooperable with retainer elements (to be described) carried by the lower carriage 3 to releasably retain the lower carriage 3 in a selected position on the base 2.

The outer edges of the two longitudinal sides 3a, 3b of the lower carriage 3 carry linear cross roller bearings 31, 32 movable over the bearing rails 21, 22 of the base. The opposite sides 3a, 3b of the lower carriage 3 further include retainer elements 33, 34, each constituted of a leaf spring 33a, 34a fixed to the lower carriage 3, and carrying a retainer ball 33b, 34b, receivable in the grooves 23, 24 of the base, for releasably retaining the lower carriage 3 in a selected position on the base 2.

Lower carriage 3 further includes a pair of bearing rails 35, 36 on its opposite sides cooperable with bearings (to be described) carried by the upper carriage 4 to permit relatively friction free movement of the upper carriage 4 with respect to the lower carriage 3.

In addition to the retainer elements 33, 34 cooperable with the grooves 23, 24 of base 2, the lower carriage 3 includes a second pair of retainer elements 37, 38 cooperable with grooves (to be described) on the upper carriage 4. Retainer elements 37, 38 are of the same construction as retainer elements 33, 34; each includes a leaf spring 37a, 38a, fixed at one end to the lower carriage, and carrying a retainer ball 37b, 38b at its free end. However, whereas retainer elements 33, 34 project outwardly of the lower carriage 3 for cooperation with grooves 23, 24 on the base 2, retainer elements 37, 38 project inwardly of the lower carriage for cooperation with corresponding grooves (to be described) on the upper carriage 4.

The upper carriage 4 includes a pair of linear cross roller bearings 41, 42 cooperable with bearing rails 35, 36 of the lower carriage. In addition, the longitudinal sides 4a, 4b of the upper carriage 4 include, on their upper surfaces, a plurality of grooves 43, 44 spaced longitudinally of the respective side for receiving the balls 37b, 38b, of the spring retainer elements 37, 38 carried by the lower carriage 3.

The lower carriage 3 is moved longitudinally of the base 2 by an electrical drive, including an electrical motor 51 fixed to the base by mounting plate 52, a pinion gear 53 rotated by the motor 51, and a rack 54 engaged by pinion gear 53 and extending longitudinally of side 3b of the lower carriage 3. Motor 51 also includes an encoder, schematically indicated at 55 to permit tracking and control of the motor, and thereby of the longitudinal positioning of the lower carriage 3 with respect to the base 2.

Similarly, the upper carriage 4 is driven to a selected position with respect to the lower carriage 3 by an electric motor 61 secured to the lower carriage 3 by a plate 62, and driving a pinion gear 63 meshing with a rack 64. The rotary movement of motor 61 is tracked by a rotary encoder 65 to permit tracking and control of the motor 61 for proper positioning of the upper carriage 4 with respect to the lower carriage 3.

The universal chuck illustrated in FIG. 1 is used for holding a plate, therein designated 70, such as a photomask or reticle, in the manufacture of semiconductor wafers. The lower carriage 3 carries a plate mounting assembly comprising member 71 at one side thereof for mounting one edge of the plate 70 to be held by the universal chuck. Additional plate mounting assembly comprising members 72, 73; 74, 75; 76, 77 are carried by the upper carriage 4 at the side opposite to that of the lower carriage carrying plate mounting member 71, for mounting the opposite edge of the plate to be held by the universal chuck. As will be described more fully below, by selectively moving the lower carriage 3 and the upper carriage 4 with respect to each other, and also with respect to the base 2, the distance between plate mounting member 71 on one side, and plate mounting members 72, 73; 74, 75; 76, 77 on the opposite side, can be changed to thereby enable the chuck to hold plates of different dimensions and configurations, while still maintaining the same central point CP (FIG. 2) of the plate so mounted to the base 2.

Mounting member 71 carried by the lower carriage 3 is in the form of a pad located on the longitudinal axis LA of the base 2.

Figure 2:
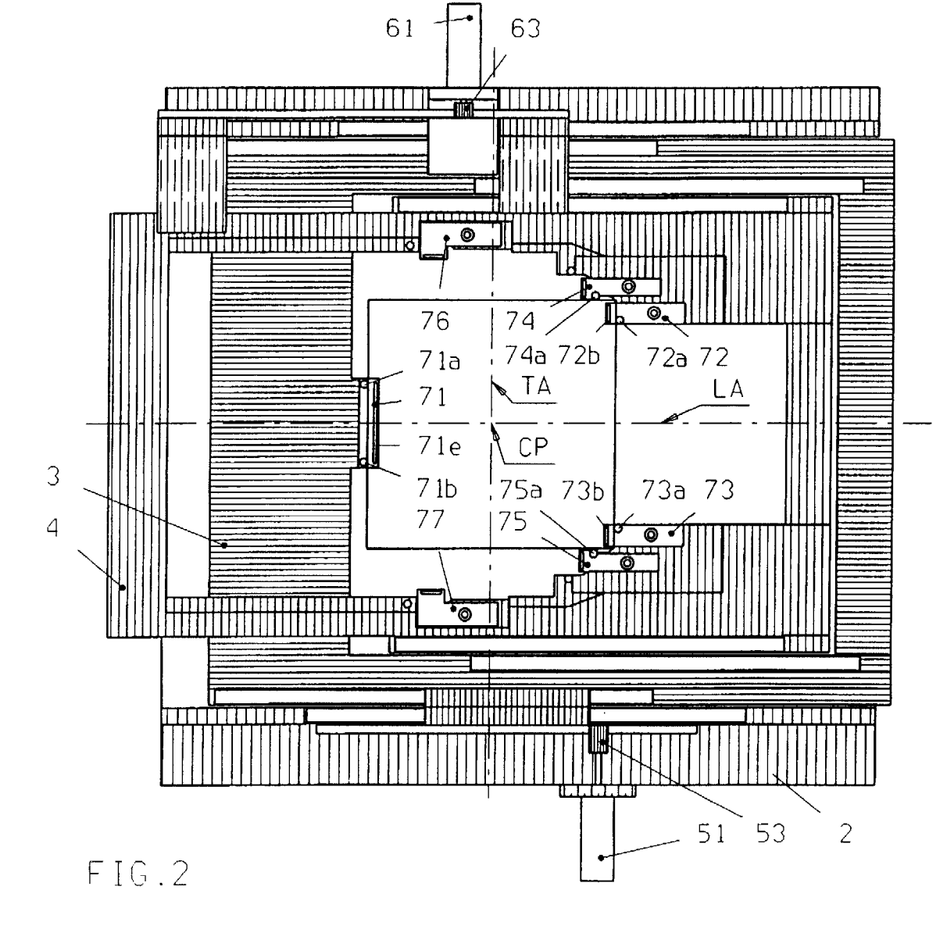
FIG. 2 is a top plan view illustrating the condition of the universal chuck of FIG. 1 for mounting a square 5" plate, such as a photomask or reticle.
Figure 3:
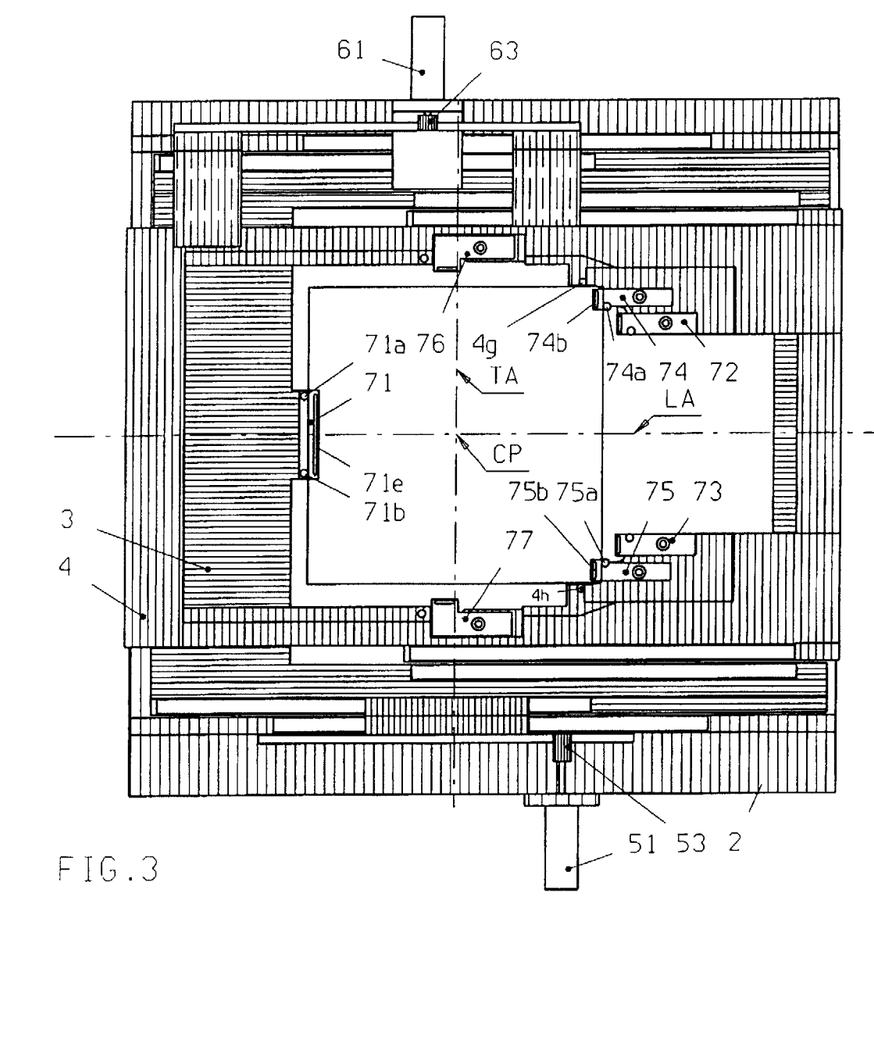
FIGS. 3 and 4 illustrate the condition of the universal chuck of FIG. 1 for mounting a 6" and a 7" square photomask or reticle, respectively.
Figure 4:
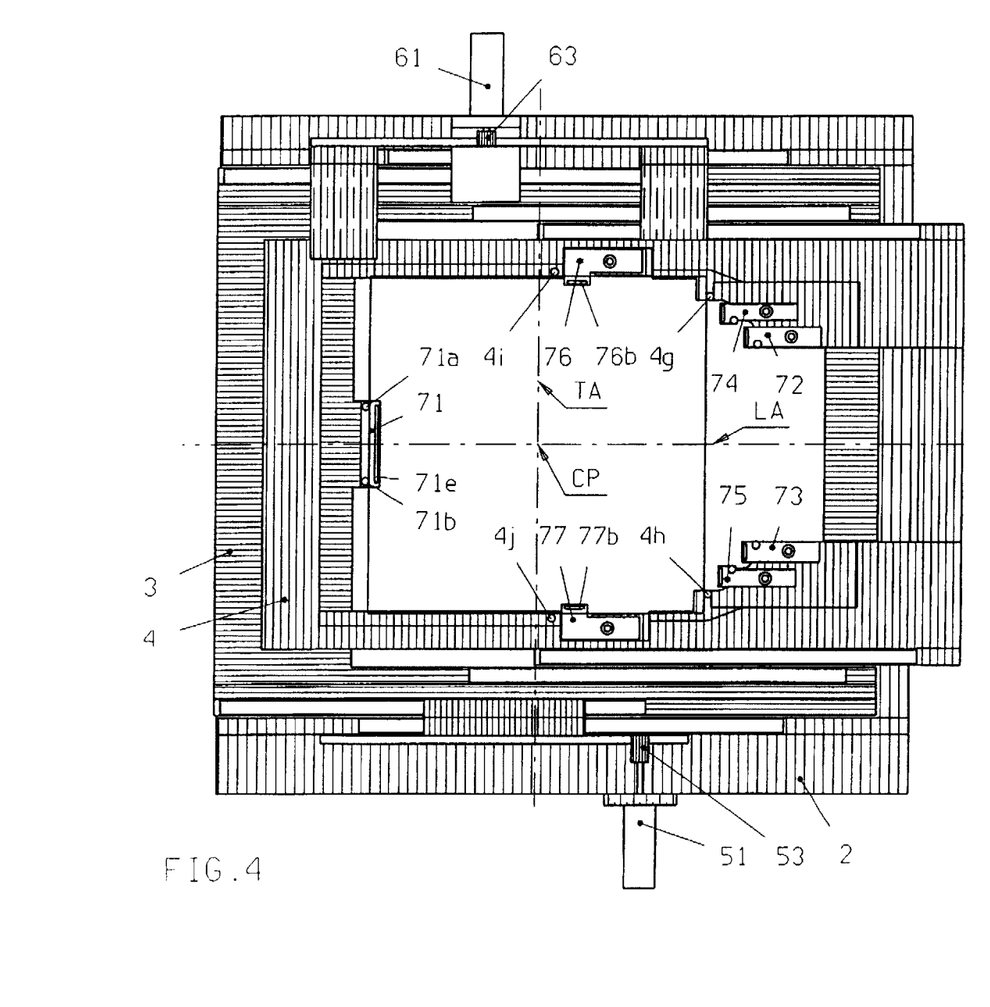
Figure 5:
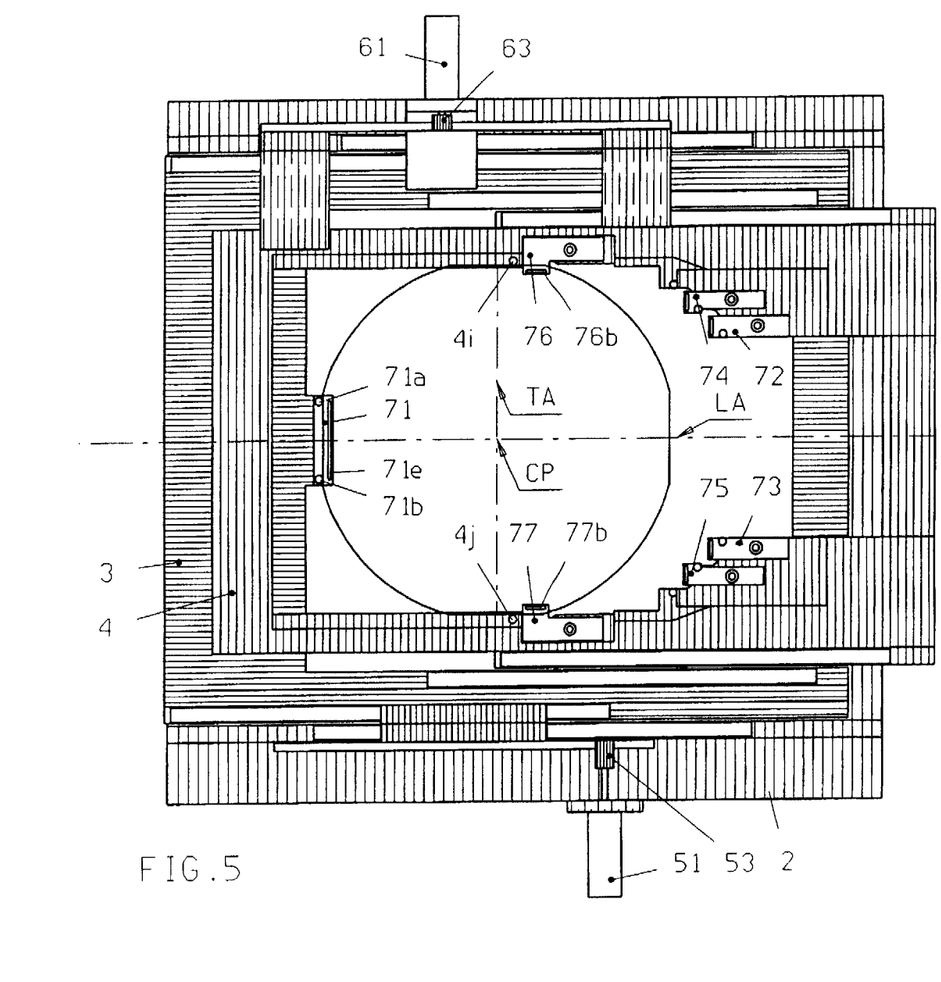
FIG. 5 is a fragmentary view illustrating the condition of the universal chuck of FIG. 1 for mounting a 7" round photomask or reticle.

Mounting members 72, 73; 74, 75; 76, 77 carried by the upper carriage 4 are also in the form of pads. These pads are selectively engageable with the opposite edge of the plate 70 to be mounted, according to the size and configuration of the plate. Thus, pads 72 and 73 are used for mounting 5" square plates as shown in FIG. 2; pads 74 and 75 are used for mounting 6" square plates as shown in FIG. 3; and pads 76 and 77 are used for mounting 7" square plates as shown in FIG. 4, as well as 7" round plates as shown in FIG. 5.

The two pads 72, 73 are spaced equal distances on opposite sides of the longitudinal axis LA for mounting 5" plates; the two pads 74, 75 are spaced equal distances on opposite sides of the longitudinal axis LA for mounting 6" plates; and the two pads 76, 77 are spaced equal distances on opposite sides of the longitudinal axis for mounting 7" square or round plates. Since all the pads 72, 73; 74, 75; 76, 77 are fixed to the same member, namely the upper carriage 4, their spacings transversely of the base are according to the size of the plate to be held by the universal chuck.

Since pad 71 is fixed to the lower carriage 3 which is movable with respect to the upper carriage 4, it will be seen that the spacing of pad 71 engageable with one edge of the plate to be mounted, with respect to pads 72, 73; 74, 75; 76, 77 selectively engageable with the opposite edge of the plate to be mounted, can be changed by moving the upper carriage 4 with respect to the lower carriage 3, according to the size of the plate to be held by the universal chuck. It will also be seen that since both the lower carriage 3 and the upper carriage 4 are movable, not only relative to each other but also relative to the base 2, the two carriages can be moved with respect to the base to maintain the centerpoint of the plate held by the universal chuck at the same location irrespective of the dimensions and configuration of the plate held by the universal chuck.

It will be appreciated that the above-described arrangement of pads 71; 72, 73; 74, 75; 76, 77 permits essentially a stable three-point mounting for each plate. Pad 71 constitutes one point, mounting one edge of the plate. The other two points of the three-point mounting are constituted by the operative pair of pads (72, 73 for 5" plates; 74, 75 for 6" plates; and 76, 77 for 7" plates) which engage the outer extremities of the opposite edge of the mounted plate.

Each of the pads 72,73; 74, 75 is provided with a locating pin engageable with the respective edge of the plate to be mounted for precisely positioning the plate during a manual loading of a reticle into the universal chuck. Thus, the pad 71 at one side includes two locating pins 71a, 71b, and each of the pads 72, 73; 74, 75 at the opposite side includes a locating pin 72a; 73a; 74a; 75a, respectively. For this purpose, there are also four additional locating pins 4g; 4h; 4i and 4j in the upper carriage 4.

During a manual loading process, the operator pushes the reticle against three pins for precise location of the reticle. For 5" reticle the pins used are 72a, 73a, 74a (FIG. 2); for 6" reticle—74a, 75a, 4g (FIG. 3); for 7" square reticle—4g, 4h, 4i (FIG. 4); for 7" round reticle—71a, 71b, 4i (FIG. 5).

During an automatic loading process by a robot, these pins are not used. There must be some pre-alignment procedure for detecting the location of the reticle on the end effector of the robot and locating the universal chuck and the end effector respectively, so that the reticle will be placed in the correct position in the universal chuck.

These pins serve not only for locating the plate (reticle, photomask, etc.), but also for retaining the plate should the vacuum fail.

Pad 71 is fixed, but each of the pads 72, 73; 74, 75; 76, 77 is vertically adjustable (e.g., by mounting the pad on a threaded pin) to allow leveling of the plate to be held by the universal chuck. In addition, each pad is also formed with suction ports, as shown at 71e and 72b; 73b; 74b; 75b; 76b and 77b, respectively, connectable to a suction source 80 (FIG. 1) for securely holding the plate by suction on the universal chuck.

Figure 6:
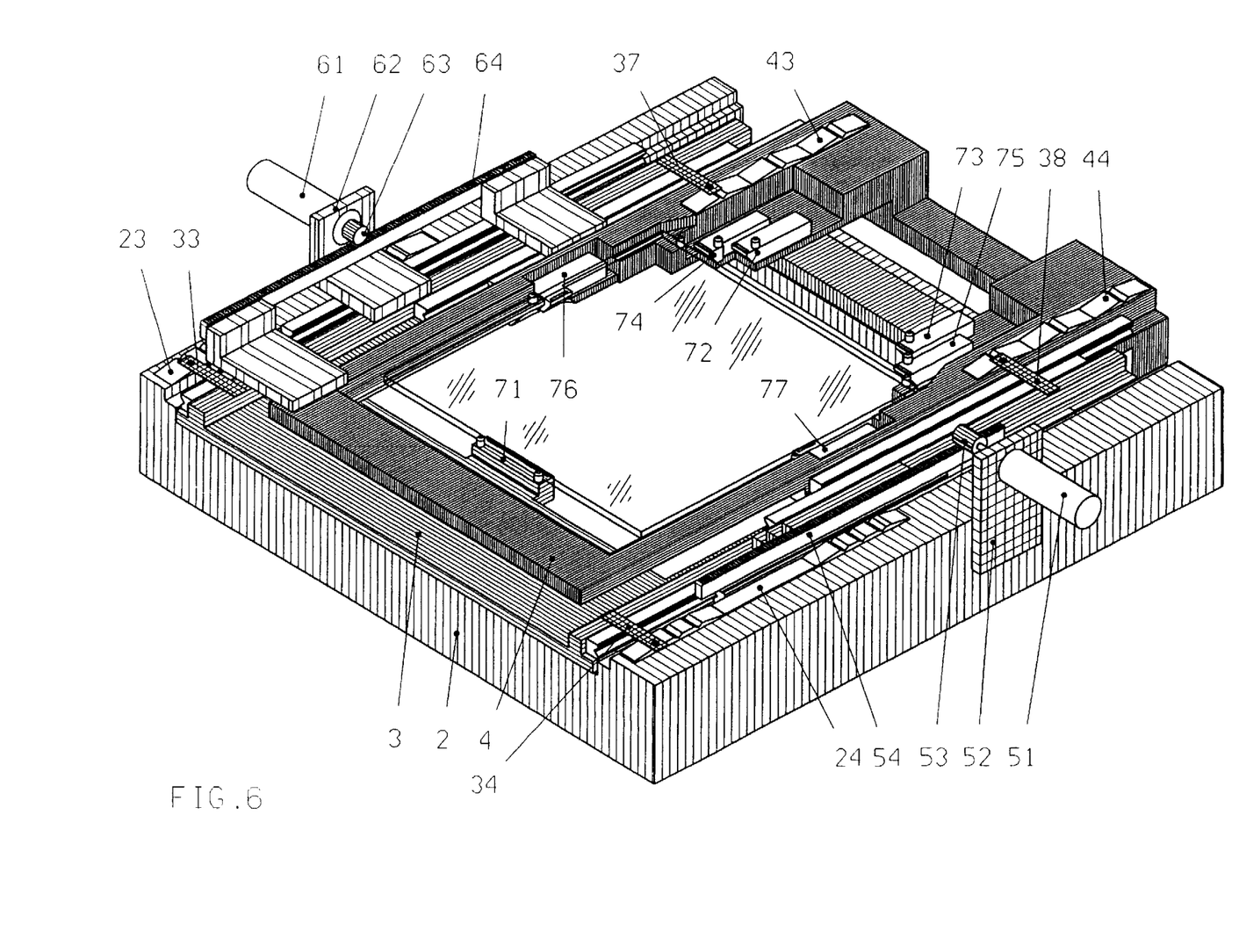
FIG. 6 is a three-dimensional view illustrating the universal chuck of FIG. 1 in a closed, i.e., working, condition.

The manner of using the universal chuck illustrated in FIG. 1 will be apparent from the above description. FIG. 6 illustrates the universal chuck in its closed, working condition. It may be loaded manually, or automatically by a robot. Thus, FIG. 7 illustrates the fork arm 81 (frequently called the end effector) of the robot carrying the plate 82 (e.g., photomask or reticle) to be loaded in the universal chuck. Fork arm 81 traverses the same stroke irrespective of the size of the plate to be loaded. It passes through the slots 3f, 4f in the respective side 3d, 4d of the two carriages 3 and 4, respectively, and deposits the plate 82 on the respective pads 71; 72, 73; 74, 75; 76, 77, which pads were previously pre-positioned according to the size of the plate to be loaded.

Thus, when the universal chuck is to be used for holding a 5" square plate, the drive motors 51 and 61 would be controlled to position the lower carriage 3 and upper carriage 4, respectively, to the positions illustrated in FIG. 2, such that pad 71 carried by the lower carriage 3 engages one edge of the plate to be mounted, whereas pads 72 and 73 carried by the upper carriage 4 are effective to engage the opposite edge of the plate. If a 6" plate is to be mounted as shown in FIG. 3, the two carriages are moved to the positions in FIG. 3 to make pads 74 and 75 effective to engage the opposite edge of the plate; and if a 7" plate is to be mounted, either of the square shape as illustrated in FIG. 4 or of the round shape as illustrated in FIG. 5, the two carriages 3 and 4 are controlled by their respective motors 51 and 61 to make pads 76 and 77 operative for engaging the opposite edge of the plate to be mounted.

Since the base 2 and the two carriages 3 and 4 are of an open rectangular configuration, the illustrated universal chuck permits access, both mechanical and optical, to both sides of the mounted plate. Such a universal chuck is thus particularly useful for mounting photomasks and reticles for processing and/or inspection, but it will be appreciated that such a chuck could be used in many other applications for holding plates of various sizes and/or configurations.

Accordingly, while the invention has been described with respect to one preferred embodiment, it will be appreciated that this is set forth merely for purposes of example, and that many other variations, modifications and applications of the invention may be made.

We claim:

1. A universal chuck for holding plates, comprising:
    a base having a longitudinal axis and a transverse axis;
    a lower carriage movable on said base along said longitudinal axis;
    an upper carriage movable on said lower carriage along said longitudinal axis;
    a first plate mounting assembly carried by said lower carriage at one side thereof for mounting one edge of a plate to be held by the universal chuck; and
    a second plate mounting assembly carried by said upper carriage and oriented to oppose said first plate mounting assembly, for mounting the opposite edge of the plate to be held by the universal chuck, such that moving the lower carriage and the upper carriage with respect to each other and with respect to said base along said longitudinal axis, changes the distance between said lower carriage and upper carriage plate mountings to thereby enable the chuck to hold plates of different longitudinal dimensions.

2. The universal chuck according to claim 1, wherein said base, lower carriage, and upper carriage are all of open rectangular configuration to allow access to both sides of a plate mounted by the chuck.

3. The universal chuck according to claim 1, wherein one of said first and second plate mounting assemblies comprise a pad located on said longitudinal axis of the base, and the other of said first and second plate mounting assemblies comprise a pair of pads equally spaced transversely from the longitudinal axis of the base such as to provide a three-point mounting for a plate held by the chuck.

4. The universal chuck according to claim 3, wherein said other plate mounting assembly includes a plurality of pairs of pads, which pairs are spaced from each other at different distances along both said transverse axis and said longitudinal axis of the base to accommodate plates of different longitudinal and transverse dimensions.

5. The universal chuck according to claim 4, wherein said pad located on the longitudinal axis of the base is carried by said lower carriage, and said pairs of pads are carried by said upper carriage.

6. The universal chuck according to claim 4, wherein said pads include locating pins engageable with edges of a plate to be mounted thereon for precise positioning of the plate.

7. The universal chuck according to claim 5, wherein said pads include locating pins engageable with edges of a plate to be mounted thereon for precise positioning of the plate.

8. The universal chuck according to claim 6, wherein said upper carriage also includes locating pins engageable with edges of a plate to be mounted thereon for precise positioning of the plate.

9. The universal chuck according to claim 7, wherein said upper carriage also includes locating pins engageable with edges of a plate to be mounted thereon for precise positioning of the plate.

10. The universal chuck according to claim 1, wherein said plate mountings include suction ports connectible to a suction source for holding a plate by suction.

11. The universal chuck according to claim 1, wherein said base and said lower carriage include cooperable retainer members for retaining the lower carriage in its moved position on said base.

12. The universal chuck according to claim 11, wherein said cooperable retainer members include a surface formation on said base formed with a plurality of grooves spaced along the longitudinal axis of the base, and a spring-urged retainer element carried by said lower carriage receivable in said grooves for retaining the lower carriage in its moved position on said base.

13. The universal chuck according to claim 12, wherein said spring-urged retainer element comprises a ball and a leaf spring secured to said lower carriage.

14. The universal chuck according to claim 11, wherein said lower carriage and said upper carriage also include cooperable retainer members for retaining the upper carriage in its moved position on said lower carriage.

15. The universal chuck according to claim 14, wherein said latter cooperable retainer members include a surface formation on one of said carriages formed with a plurality of grooves spaced along the longitudinal axis of the base, and a spring-urged retainer element carried by the other of said carriages received in said grooves for retaining the upper carriage in its moved position on said lower carriage.

16. The universal chuck according to claim 15, wherein said spring-urged retainer element comprises a ball and a leaf spring secured to said other carriage.

17. The universal chuck according to claim 14, wherein said base and lower carriage include a pair of said cooperable retainer members on the opposite longitudinal sides of the base and lower carriages; and wherein said lower carriage and upper carriage include a pair of said cooperable retainer members on the opposite longitudinal sides of the lower carriage and upper carriage.

18. The universal chuck according to claim 1, further including an electrical drive for said lower carriage and an electrical drive for said upper carriage.

19. The universal chuck according to claim 18, wherein said electrical drive for the lower carriage includes a rotary motor carried by said base, a pinion gear rotated by said motor, and a rack fixed to said lower carriage along said longitudinal axis and meshing with said pinion gear.

20. The universal chuck according to claim 19, wherein said electrical drive for the upper carriage includes a second rotary motor carried by said lower carriage, a second pinion gear rotated by said second motor, and a rack fixed to said upper carriage along said longitudinal axis and meshing with said second pinion gear.

21. The universal chuck according to claim 20, wherein each of said motors, also drives a rotary encoder for tracking and controlling the movements of the motors.

22. The universal chuck according to claim 1, further comprising a first linear cross roller bearings carried by said base, and a second linear cross roller bearings carried by said lower carriage.

* * * * *